(12) United States Patent
Fujii

(10) Patent No.: US 7,466,000 B2
(45) Date of Patent: Dec. 16, 2008

(54) SEMICONDUCTOR DEVICE HAVING MULTIPLE SUBSTRATES

(75) Inventor: Tetsuo Fujii, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 333 days.

(21) Appl. No.: 11/268,524

(22) Filed: Nov. 8, 2005

(65) Prior Publication Data
US 2006/0055001 A1 Mar. 16, 2006

Related U.S. Application Data

(62) Division of application No. 10/806,274, filed on Mar. 23, 2004, now Pat. No. 6,979,873.

(30) Foreign Application Priority Data

Mar. 27, 2003 (JP) ............................... 2003-88934
Dec. 25, 2003 (JP) ............................... 2003-430049

(51) Int. Cl.
*G01P 15/125* (2006.01)
(52) U.S. Cl. .................... 257/417; 73/514.01
(58) Field of Classification Search ................ 257/415, 257/417, 685, 686, 777, 778; 73/493, 514.01
See application file for complete search history.

(56) References Cited
U.S. PATENT DOCUMENTS
6,153,917 A 11/2000 Matsunaga et al.

| | | | |
|---|---|---|---|
| 6,167,761 B1 | 1/2001 | Hanzawa et al. | |
| 6,316,840 B1 * | 11/2001 | Otani | 257/787 |
| 6,518,084 B1 * | 2/2003 | Seitz et al. | 438/53 |
| 2003/0047804 A1 * | 3/2003 | Otani | 257/723 |

FOREIGN PATENT DOCUMENTS
JP A-2002-50771 2/2002

* cited by examiner

*Primary Examiner*—Thomas L Dickey
(74) *Attorney, Agent, or Firm*—Posz Law Group, PLC

(57) ABSTRACT

A semiconductor device includes a first substrate including first, second and third layers; a second substrate; and a loop bump. The first and second substrates provides an electric device and physical quantity sensor. The first layer is a shield for protecting the electric device and physical quantity sensor. The physical quantity sensor includes a movable portion surrounded by a first loop layer of the third layer. The loop bump is disposed between the first and second substrates and surrounds the movable portion, and is electrically coupled with the first loop layer so that the loop bump, first loop layer, first layer and second substrate shield the electric device and physical quantity sensor. The first substrate includes inner and outer pads which are electrically coupled through a wire layer which is electrically insulated from the loop bump, so that a signal from the movable portion is output to and external circuit.

25 Claims, 9 Drawing Sheets

SEMICONDUCTOR DEVICE HAVING MULTIPLE SUBSTRATES

CROSS REFERENCE TO RELATED APPLICATIONS

This application is a divisional application of U.S. patent application Ser. No. 10/806,274 filed on Mar. 23, 2004 now U.S. Pat. No. 6,979,873, which is based on Japanese Patent Applications No. 2003-88934filed on Mar. 27, 2003, and No. 2003-430049 filed on Dec. 25, 2003, the disclosures of which are incorporated herein by reference.

FIELD OF THE INVENTION

The present invention relates to a semiconductor device having multiple substrates.

BACKGROUND OF THE INVENTION

A semiconductor device 101 is disclosed, for example, in Japanese Patent Application Publication No. 2001-227902 (i.e., U.S. Pat. No. 6,316,840). The device 101 includes a sensor module 111 for detecting physical quantity such as acceleration, pressure and angular rate, as shown in FIG. 17. The sensor module 111 provides an acceleration sensor, a pressure sensor or an angular rate sensor. In the sensor module 111, a movable portion 50 is disposed on a principal plane of a sensor substrate, i.e., a sensor chip 52. The sensor chip 52 includes at least the movable portion 50 and an electric device (not shown). The electric device outputs an electric signal corresponding to a displacement of the movable portion 50. The electric signal outputted from the electric device is transmitted to a processing substrate, i.e., a signal processor 53 through a bump 21. The signal processor 53 performs a predetermined signal processing so that the physical quantity is detected.

The signal processor 53 is provided by an application specific integrated circuit (i.e., ASIC) so that the signal processor 53 calculates the physical quantity such as the acceleration, the pressure or the angular rate on the basis of the electric signal outputted from the sensor chip 52. Further, the signal processor 53 sends a predetermined control signal to the sensor chip 52 so that the movable portion 50 and the electric device are controlled electrically.

The sensor chip 52 and the signal processor 53 are mounted on a die pad 55 of a lead frame. The signal processor 53 is electrically connected to an inner lead 56 through a wire 54. The sensor chip 52 and the signal processor 53 together with the die pad 55 and the inner lead 56 are sealed in a resin mold 57 so as to provide a resin mold package.

The die pad 55 of the sensor module 111 is disposed below the inner lead 56. Specifically, the die pad 55 is disposed at lower position lower than the inner lead 56 so as to provide a low die pad construction. This construction provides that the height of the inner lead 56 is almost the same as the height of semiconductor parts such as the signal processor 53 disposed on the die pad 55. Therefore, the wire 54 is easily bonded between the inner lead 56 and the semiconductor parts.

It is required to secure a movement (i.e., displacement) of the movable portion 50. Specifically, it is required for the movable portion 50 to move smoothly. In general, the movable portion 50 is covered with a casing so that the casing prevents resin composing the resin mold 57 from penetrating into the casing. However, total number of parts is increased because of the casing. Therefore, manufacturing cost is increased. Further, it is necessitated to bond the casing to the sensor chip 52. Therefore, additional manufacturing process is necessitated so that the manufacturing cost is much increased.

In view of the above problem, in the semiconductor device 101, the signal processor 53 is disposed on the die pad 55, and the sensor chip 52 is disposed on the signal processor 53. A resin sealing 70 seals between the periphery of the sensor chip 52 and the principal plane of the signal processor 53. The resin sealing 70 is disposed all around the periphery of the sensor chip 52 so that a closed spacing 71 is provided by the resin sealing 70, the sensor chip 52 and the signal processor 53. The sensor chip 52 includes multiple bumps 21 disposed on the principal plane. The bumps 21 are connected to electrodes disposed on the principal plane of the signal processor 53 so that the sensor chip 52 electrically connects to the signal processor 53. The signal processor 53 is connected to the inner lead 56 through the wire 54. Thus, the resin material composing the resin mold 57 is prevented from penetrating into the closed spacing 71 so that the movable portion 50 can move smoothly.

However, it is necessitated to protect the sensor module 111 from outside disturbance such as noise. Therefore, a shield (not shown) is necessitated for protecting the sensor module 111. The shield made of metal and the like is disposed on the sensor module 111. Thus, total number of parts of the semiconductor device 101 is increased because of the additional shield. Therefore, additional manufacturing process is necessitated so that the manufacturing cost of the device 101 is increased.

SUMMARY OF THE INVENTION

In view of the above-mentioned problems, it is an object of the present invention to provide a semiconductor device having multiple substrates. Specifically, the device is protected from outside disturbance without adding an additional shield.

A semiconductor device includes a first substrate including first, second and third layers; and a second substrate including fourth, fifth and sixth layers. The first substrate provides an electric device. The second substrate provides a physical quantity sensor. The first layer of the first substrate and the fourth layer of the second substrate are shields for protecting the electric device and the physical quantity sensor.

In the device, the electric device and the sensor are protected from malfunctioning without any additional shield. Specifically, the device is protected from outside disturbance without adding an additional shield. Thus, the number of the parts composing the device is reduced, and the manufacturing process of the device is also reduced, so that the manufacturing cost of the device is reduced.

Preferably, the first layer and the fourth layer are grounded. Preferably, the electric device is disposed in the third layer of the first substrate. The physical quantity sensor is disposed in the sixth layer of the second substrate. The second layer of the first substrate is made of an insulation layer so that the first and third layers are electrically isolated. The fifth layer of the second substrate is made of an insulation layer so that the fourth and sixth layers are electrically isolated. More preferably, the physical quantity sensor includes a movable portion disposed in the sixth layer. The movable portion is movable in accordance with a physical quantity applied to the device so that the physical quantity sensor outputs a signal corresponding to a displacement of the movable portion. The first substrate faces the second substrate so that the electric device electrically connects to the physical quantity sensor. Furthermore preferably, the second substrate includes a bump disposed on the sixth layer of the second substrate. The third layer of the first substrate faces the sixth layer of the second substrate so that the first substrate electrically is connected to the second substrate through the bump. The first layer of the first substrate and the fourth layer of the second substrate are disposed outside. Furthermore preferably, the first and third layers of the first substrate are made of semiconductor. The fourth and sixth layers of the second substrate are made of semiconductor. The electric device controls the physical quantity sensor, and the physical quantity sensor outputs the signal to the electric device through the bump. Furthermore preferably, the physical quantity sensor is an acceleration sensor, an angular rate sensor or a pressure sensor. The first and second substrates are provided by a silicon-on-insulator substrate. The electric device is a signal processor.

Preferably, the device further includes a first loop layer disposed in the third layer of the first substrate; and a second loop layer disposed in the sixth layer of the second substrate. The first and second loop layers are connected with a loop bump. The first and second loop layers with the loop bump are shields for protecting the electric device and the physical quantity sensor. More preferably, the first and second loop layers with the loop bump are grounded. Furthermore preferably, the first loop layer surrounds the electric device, and the second loop layer surrounds the physical quantity sensor. The loop bump has a loop shape. Furthermore preferably, the device further includes a first shield layer disposed between the third layer and the second layer of the first substrate; and a second shield layer disposed between the sixth layer and the fifth layer. The first loop layer is electrically connected to the first shield layer through a first contact portion. The second loop layer is electrically connected to the second shield layer through a second contact portion. The electric device and the physical quantity sensor are covered with the first and second loop layers, the first and second contact portions, the first and second shield layers and the loop bump.

Further, a semiconductor device includes a first substrate including first, second and third layers; and a second substrate. The first substrate provides one of an electric device and a physical quantity sensor. The second substrate provides the other one of the electric device and the physical quantity sensor. The first layer of the first substrate is a shield for protecting the electric device and the physical quantity sensor.

In the device, the electric device and the sensor are protected from malfunctioning without any additional shield. Specifically, the device is protected from outside disturbance without adding an additional shield. Thus, the number of the parts composing the device is reduced, and the manufacturing process of the device is also reduced, so that the manufacturing cost of the device is reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
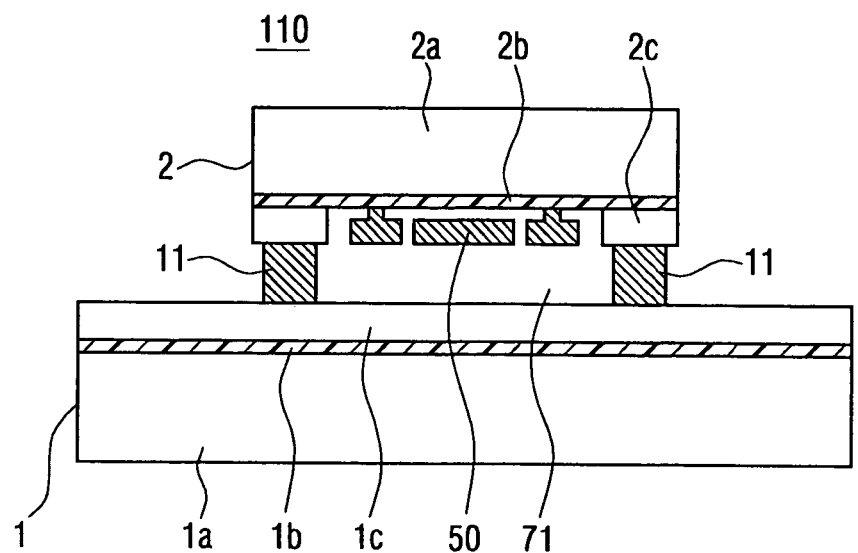
FIG. 1 is a cross sectional view showing a sensor module of a semiconductor device according to a first embodiment of the present invention.
Figure 2:
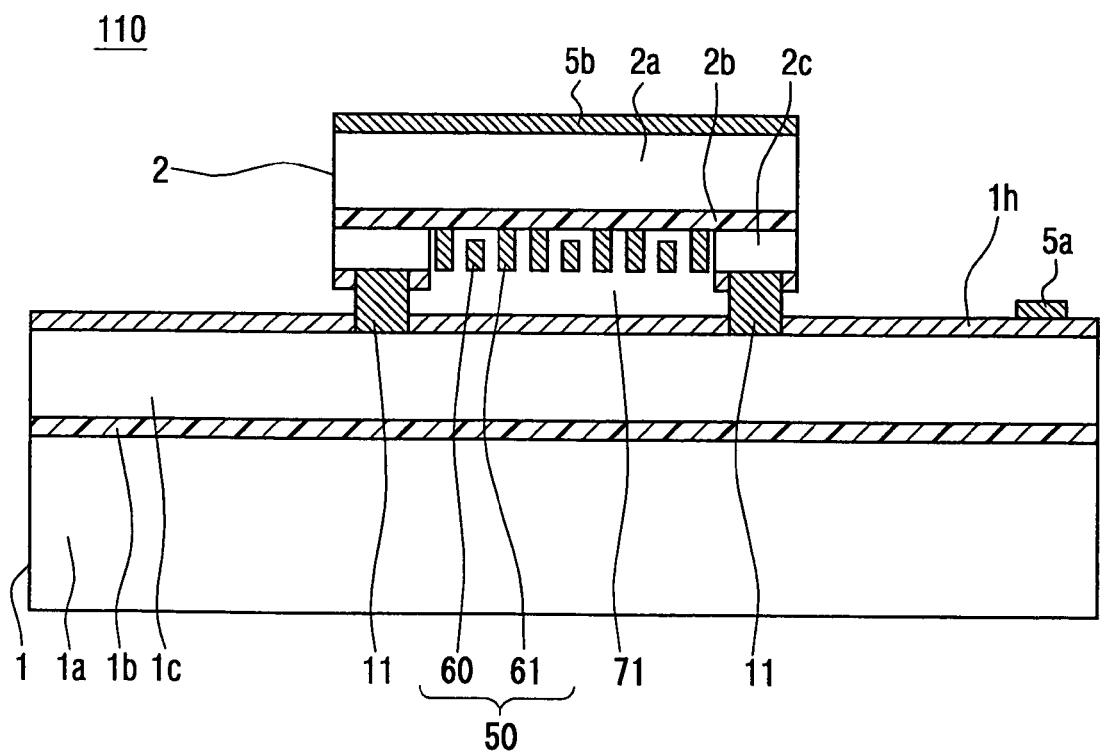
FIG. 2 is a cross sectional view showing the detail of the sensor module, according to the first embodiment.
Figure 3:
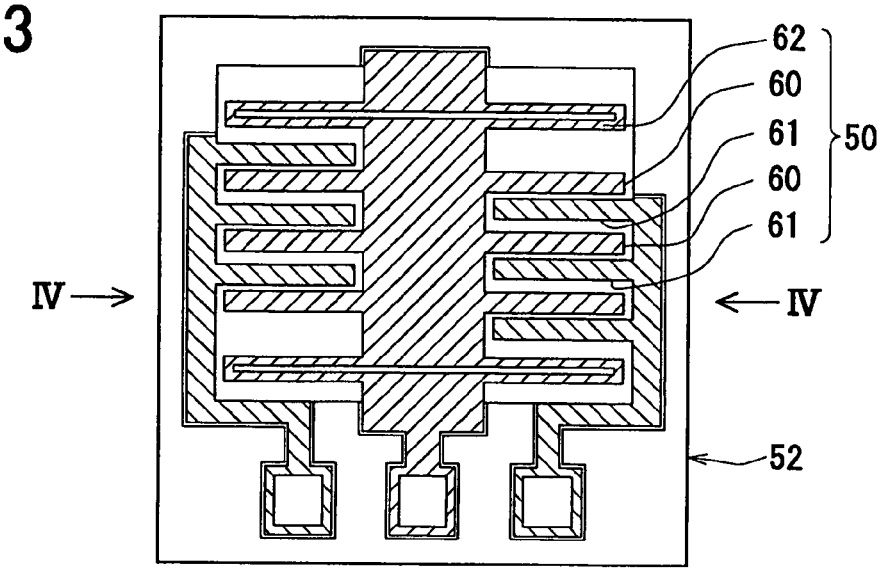
FIG. 3 is a plan view showing a sensor chip of the device according to the first embodiment.
Figure 4:
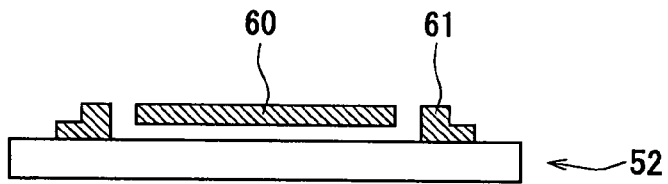
FIG. 4 is a cross sectional view showing the sensor chip taken along line IV-IV in FIG. 3.
Figure 5:
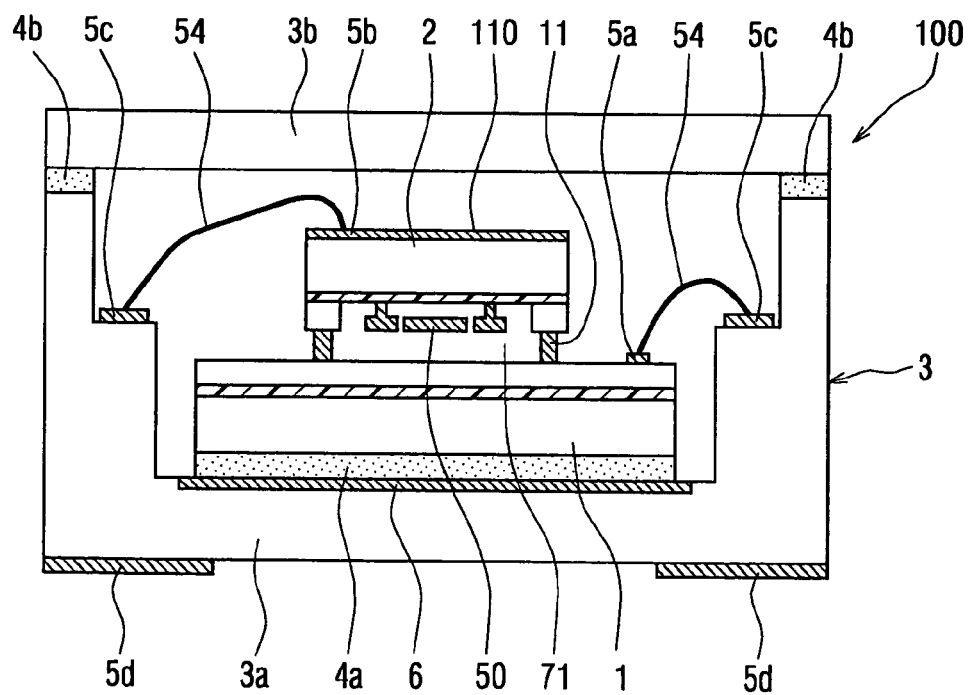
FIG. 5 is a cross sectional view showing the semiconductor device according to the first embodiment.

A semiconductor device 100 having a physical quantity sensor module 110 according to a first embodiment of the present invention is shown in FIGS. 1-5. The sensor module 110 includes a capacitance type semiconductor acceleration sensor. FIG. 1 shows a sensor module 110, and FIG. 2 shows the detail of the sensor module 110. The sensor module 110 includes a sensor chip 52 and a signal processor 53. The sensor chip 52 of the sensor module 110 is for example, shown in FIGS. 3 and 4. The device 100 with the sensor module 110 is shown in FIG. 5, which is a whole construction including a package for accommodating the sensor module 110 therein.

As shown in FIG. 1, the sensor module 110 includes the first and second substrate 1, 2. The first substrate 1 for providing the signal processor 53 includes the first silicon layer 1a as the first semiconductor layer, an oxide film 1b as an insulation layer, and the second silicon layer 1c as the second semiconductor layer, all of which are stacked in this order. Therefore, the first substrate 1 is a silicon-on-insulator (i.e., SOI) substrate having a rectangular shape. Similarly, the second substrate 2 for providing the sensor chip 52 includes the first silicon layer 2a as the first semiconductor layer, an oxide film 2b as an insulation layer, and the second silicon layer 2c as the second semiconductor layer, all of which are stacked in this order. Therefore, the second substrate 2 is a SOI substrate having a rectangular shape.

The second substrate 2 includes a movable portion 50 and multiple protruded electrodes (i.e., bump electrodes) 11. The movable electrode 50 is disposed on the second silicon layer 2c separated from the first silicon layer 2a by the oxide film 2b. The bump electrodes 11 are disposed around the movable portion 50. The bump electrode 11 connects to a signal processing circuit (not shown) of the first substrate 1 so that the second substrate 2 is electrically connected to the first substrate 1 through the bump 11 electrodes. Thus, the second substrate 2 provides a flip chip bonding type semiconductor substrate (i.e., a flip chip type substrate). Here, the signal processing circuit is disposed in the second silicon layer 1c separated from the first silicon layer 1a by the oxide film 1b. Thus, the first substrate 1 is electrically connected to the second substrate 2 without a wire. Therefore, a parasitic capacitance generated in the sensor module 110 is reduced.

Thus, the first substrate 1 and the second substrate 2 are connected together with the flip chip type connection method. Therefore, the movable portion 50 faces the principal plane of the first substrate 1. A closed spacing 71 is disposed between the movable portion 50 and the principal plane of the first substrate 1 in order to prevent the movable portion 50 from contacting the principal plane of the first substrate 1. The first substrate 1 also works as a stopper for limiting a movable electrode 60 of the movable portion 50 from moving toward an opposite direction of the principal plane of the second substrate 2 without limitation.

FIGS. 3 and 4 show the sensor chip 52 of the sensor module 110 having the movable portion 50 being used for an acceleration sensor. The sensor chip 52 includes the movable portion 50 having the movable electrode 60 and a fixed electrode 61. The movable electrode 60 is movably supported on a beam 62. The fixed electrode 61 faces the movable electrode 60 so that a capacitor having a capacitance is formed therebetween. Therefore, a clearance is formed between the fixed electrode 61 and the movable electrode 60. The fixed electrode 61 also works as an electrode of an electric device for detecting a capacitance change of the capacitor in accordance with the displacement of the movable electrode 60.

As shown in FIG. 5, the sensor module 110 is accommodated in a package 3, which is composed of a base 3a and a cover 3b. Specifically, the sensor module 110 is disposed on the bottom of the base 3a having a concavity through a conductive adhesion 4a. The upper portion of the sensor module 110 is covered with the cover 3b. The cover 3b is bonded to the base 3a with an adhesion 4b. If necessary, the cover 3b and the base 3a are bonded in vacuum, or dry air or dry nitrogen gas is introduced into the package 3, so that the package 3 is sealed air-tightly. The package 3 is made of, for example, ceramics, and the adhesion 4b is, for example, adhesion bond or brazing metal.

The first electrode pad 5a is disposed on a predetermined position of one side of the first substrate 1. A metal layer 5b is disposed on one side of the second substrate 2, which is opposite to the movable portion 50. Specifically, the metal layer 5b is formed on all surface of the one side of the second substrate 2. The second electrode pad 5c is disposed on a predetermined position of the package 3. The second electrode pad 5c is electrically connected to the third electrode pad 5d through a via-hole formed in the base 3a. Therefore, the first and second electrode pads 5a, 5c are electrically connected with a wire 54, and the metal layer 5b and the second electrode pad 5c are electrically connected with the wire 54 so that the first and second substrate 1, 2 and the package 3 are electrically connected together.

Thus, a signal outputted from the sensor module 110 to the package 3 is outputted from the third electrode pad 5d disposed on the periphery of the package 3 to an outside circuit outside the package 3 through an inner wiring (not shown) of the package 3. The first electrode pad 5a is made of, for example, aluminum. The second and third electrode pads 5c, 5d are made of, for example, copper, nickel, gold or their laminated material. The wire 54 is made of, for example, aluminum or gold.

A lower electrode 6 is disposed on the base 3a of the package 3 and disposed under the sensor 100. The lower electrode 6 and the third electrode pad 5d are electrically connected through another inner wiring (not shown) of the package 3 so that the signal is outputted to the outside circuit.

In this embodiment, the first and second substrates 1, 2 are provided by the SOI substrate. The signal processor 53 is formed in the second silicon layer 1c of the first substrate 1, which is electrically insulated from the first silicon layer 1a by the oxide film 1b. The movable portion 50 is formed in the second silicon layer 2c of the second substrate 2, which is electrically insulated from the first silicon layer 2a by the oxide film 2b. The second silicon layer 1c of the first substrate 1, in which the signal processor 53 is disposed, is electrically connected through the bump electrode 11 to the second silicon layer 2c of the second substrate 2, in which the movable portion 50 is disposed. Thus, the first silicon layer 1a of the first substrate 1 and the first silicon layer 2a of the second substrate 2 work as a shield layer for protecting the movable portion 50 and the signal processor 53 from outside disturbance such as noise. Specifically, they prevent the movable portion 50 and the signal processor 53 from malfunctioning.

The first silicon layer 1a of the first substrate 1 is isolated from the signal processor 53 formed in the second silicon layer 1c by the oxide film 1b. The first silicon layer 2a of the second substrate 2 is isolated from the movable portion 50 by the oxide film 2b. Therefore, the electrical potential of each of the first silicon layers 1a, 2a does not affect the movable portion 50 and the signal processor 53.

Accordingly, the electric potentials of the first silicon layers 1a, 2a can be set to be predetermined values, which are determined independently from electric potentials of the signal processor 53 and the movable portion 50. Therefore, the electric potentials of the first silicon layers 1a, 2a can be ground potential, so that the first silicon layers 1a, 2a work as the shield layer for preventing the movable portion 50 and the signal processor 53 from malfunctioning.

Therefore, the semiconductor device 100 can have the movable portion 50 and the signal processor 53 protected from malfunctioning without any additional shield. Specifically, the device 100 is protected from outside disturbance without adding an additional shield. Thus, the number of the parts composing the device 100 is reduced, and the manufacturing process of the device 100 is also reduced, so that the manufacturing cost of the device 100 is reduced.

Second Embodiment

Figure 6:
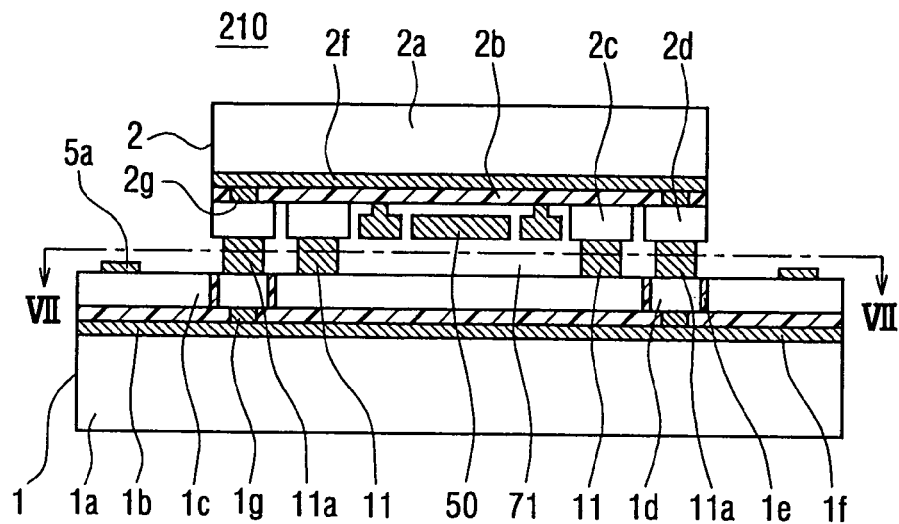
FIG. 6 is a cross sectional view showing a sensor module of a semiconductor device according to a second embodiment of the present invention.
Figure 7:
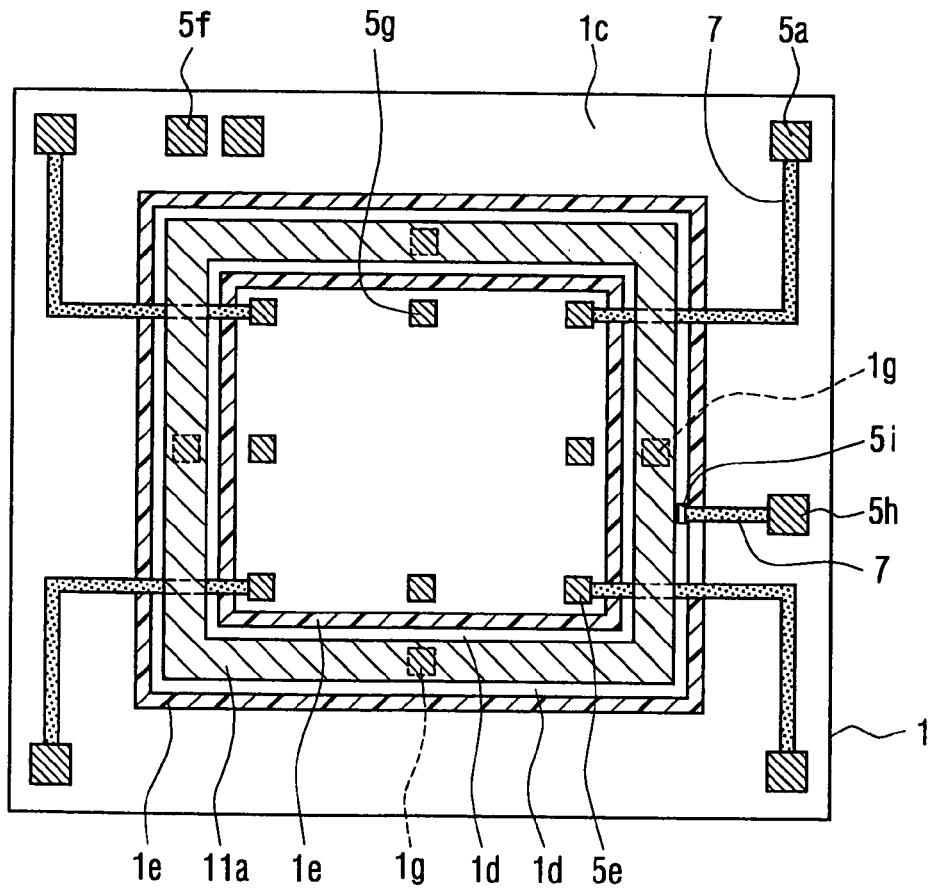
FIG. 7 is a plan view showing the first substrate of the device viewed from arrow VII-VII in FIG. 6.
Figure 8A:
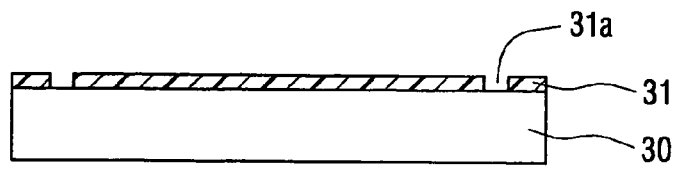
FIGS. 8A-8F are cross sectional views explaining a manufacturing method of the device according to the second embodiment.
Figure 8B:
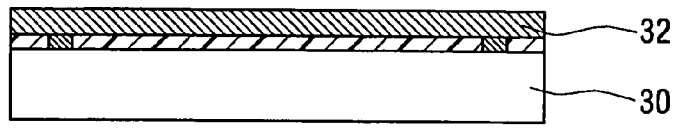
Figure 8C:
Figure 8D:
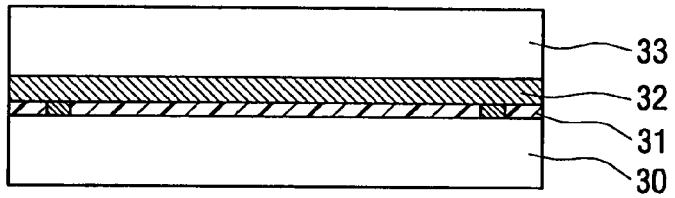
Figure 8E:
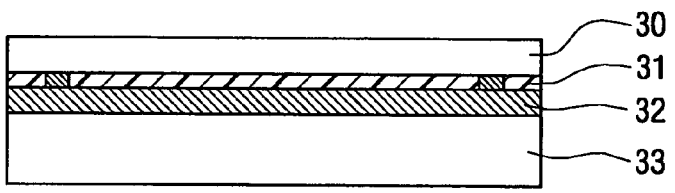
Figure 8F:
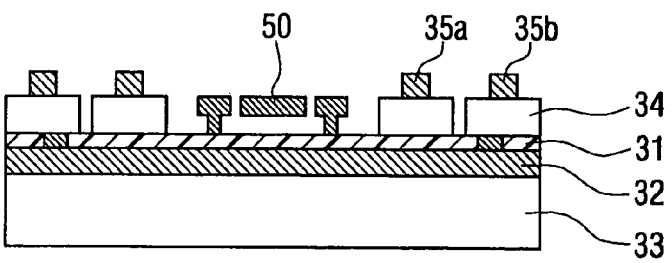

A semiconductor device 200 having a sensor module 210 according to a second embodiment of the present invention is shown in FIGS. 6-7. The sensor module 210 includes the first and second loop layers 1d, 2d. The first loop layer 1d is formed in the second silicon layer 1c of the first substrate 1, which includes the signal processor 53. The second loop layer 2d is formed in the second silicon layer 2c of the second substrate 2, which includes the movable portion 50. The first loop layer 1d is electrically connected to the second loop layer 2d through a loop bump 11a.

The first loop layer 1d of the first substrate 1 is electrically insulated from the other portion of the second silicon layer 1c of the first substrate 1 by a loop insulation portion 1e, the other portion being except for the first loop layer 1d. The first poly crystalline silicon layer 1f is disposed between the first silicon layer 1a and the oxide film 1b. The first poly crystalline silicon layer 1f is electrically connected to the first loop layer 1d through the first contact portion 1g. The loop insulation portion 1e is made of, for example, insulation material such as silicon oxide film.

The second poly crystalline silicon layer 2f is disposed between the first silicon layer 2a and the oxide film 2b. The second poly crystalline silicon layer 2f is electrically connected to the second loop layer 2d through the second contact portion 2g.

As shown in FIG. 7, the first loop layer 1d is disposed on a region, which is electrically insulated from the other portion of the second silicon layer 1c of the first substrate 1 by the loop insulation portion 1e. The loop insulation portion 1e is formed in the second silicon layer 1c of the first substrate 1, which includes the signal processor 53. The loop bump 11a is disposed on the first loop layer 1d so that the second loop layer 2d formed in the second silicon layer 2c of the second substrate 2, which includes the movable portion 50, is electrically connected to the first loop layer 1d through the loop bump 11a.

Further, the fourth electrode pad 5e is formed in the second silicon layer 1c of the first substrate 1, which includes the signal processor 53. The bump electrode 11 is disposed on the fourth electrode pad 5e. The sensor chip 52 of the second substrate 2 is electrically connected to the signal processor 53 of the first substrate 1 through the bump electrode 11. The first electrode pad 5a is disposed on a periphery of the second silicon layer 1c of the first substrate 1, which includes the signal processor 53. The fourth electrode pad 5e is electrically connected to the first electrode pad 5a through a wire layer 7 so that the signal is outputted from the sensor chip 52 disposed on the second substrate 2 and the signal processor 53 disposed on the first substrate 1 to the outside circuit. The wire layer 7 is made of, for example, aluminum and the like.

An electric circuit (not shown) is disposed on a periphery of the second silicon layer 1c of the first substrate 1. The fifth electrode pad 5f for connecting to the electric circuit is disposed on the second silicon layer 1c of the first substrate 1. The fifth electrode pad 5f performs to connect to the electric circuit.

The sixth electrode pad 5g for connecting to inner circuits is disposed inside of the loop insulation portion 1e of the second silicon layer 1c of the first substrate 1. The sixth electrode pad 5g performs to connect between the inner circuits disposed inside of the loop insulation portion 1e. Further, the seventh electrode pad 5h for controlling the electric potential of the first loop layer 1d is disposed on a periphery of the second silicon layer 1c of the first substrate 1. The eighth electrode pad 5i is disposed on the first loop layer 1d. The seventh electrode pad 5h and the eighth electrode pad 5i are electrically connected together with the wire layer 7 so that the electric potential of the first loop layer 1d is controlled (i.e., adjusted).

An insulation layer (not shown) is formed between the wire layer 7 and the loop bump 11a so that the wire layer 7 and the loop bump 11a are electrically isolated. Specifically, the insulation layer is disposed at least on a region, at which the wire layer 7 and the loop bump 11a overlap.

The sensor module 210 is manufactured by the following method, as shown in FIGS. 8A-8F. Here, the manufacturing method for manufacturing the second substrate 2 is described as follows. However, the first substrate 1 can be also manufactured by almost the similar method. As shown in FIG. 5A, the first silicon wafer 30 is prepared. The first silicon wafer 30 includes an impurity (i.e., dopant) having N type conductivity such as phosphorus (i.e., P) or arsen (i.e., As). The first silicon wafer 30 has specific resistance between 0.001 $\Omega\cdot$cm and 10 $\Omega\cdot$cm. Preferably, the specific resistance is between 0.001 $\Omega\cdot$cm and 0.1 $\Omega\cdot$cm. A thermal oxidation film 31 is formed on one side of the first silicon wafer 30 by using thermal oxidation method. A contact hole 31a is formed in the thermal oxidation film 31 at a predetermined position by using photolithography and the like.

As shown in FIG. 5B, a poly crystalline silicon film 32 is formed on the thermal oxidation film 31 having the contact hole 31a by using the CVD (i.e., chemical vapor deposition) method and the like. The poly crystalline silicon film 32 includes a large amount of impurities having N type conductivity such as P or As, i.e., the poly crystalline silicon film 32 includes the impurities at high concentration (e.g., between $1\times10^{16}$cm$^{-3}$ and $1\times10^{21}$cm$^{-3}$). Then, the surface of the poly crystalline silicon film 32 is polished so as to obtain mirror surface.

As shown in FIG. 5C, the second silicon wafer 33 is prepared. The second silicon wafer 33 includes an impurity having N type conductivity such as P or As. The second silicon wafer 33 has specific resistance between 0.001 $\Omega\cdot$cm and 10 $\Omega\cdot$cm. Preferably, the specific resistance is between 0.001 $\Omega\cdot$cm and 0.1 $\Omega\cdot$cm. Thus, the specific resistance of the second silicon wafer 33 is almost the same as that of the first silicon wafer 30.

As shown in FIG. 5D, the poly crystalline silicon film 32 of the first silicon wafer 30 is bonded to one side of the second silicon wafer 33. This bonding is performed in inert gas such as nitrogen gas.

As shown in FIG. 5E, the other side of the first silicon wafer 30, which is opposite to the poly crystalline silicon film 32, is polished so that the first silicon wafer 30 is thinned. And the first silicon wafer 30 with the second silicon wafer 33 is turned upside down.

As shown in FIG. 5F, the movable portion 50 is formed in the first silicon wafer 30 by using the dry-etching method and the like. Here, the movable portion 50 provides an acceleration sensor. The movable portion 50 is electrically connected to a bump 35a. At that time, a loop layer 34 is formed at a periphery of the first silicon wafer 30. A bump 35a is disposed on the first silicon wafer 30, and another bump 35b is disposed on the loop layer 34 so that the sensor chip 52 of the second substrate 2 and the signal processor 53 of the first substrate 1 are electrically connected together with the bumps 35a, 35b. The bumps 35a, 35b are made of a multi-layered material. The multi-layered material is provided by a combination of nickel (i.e., Ni) copper (i.e., Cu) and gold (i.e., Au) deposited on aluminum layer.

In the second embodiment, the first loop layer 1d is formed in the second silicon layer 1c of the first substrate 1, which includes the signal processor 53. The second loop layer 2d is formed in the second silicon layer 2c of the second substrate 2, which includes the movable portion 50. The first and second loop layers 1d, 2d are electrically connected together with the loop bump 11a.

The first loop layer 1d of the first substrate 1 is electrically isolated from the other portion of the second silicon layer 1c of the first substrate 1 by the loop insulation portion 1e. The other portion is disposed except for the first loop layer 1d. The poly crystalline silicon layer 1f disposed between the first silicon layer 1a and the oxide film 1b is electrically connected to the first loop layer 1d through the first contact portion 1g.

The second loop layer 2d is electrically connected to the second poly crystalline silicon layer 2f through the second contact portion 2g. The second poly crystalline silicon layer 2f is disposed between the first silicon layer 2a and the oxide film 2b of the second substrate 2.

The first silicon layer 1a of the first substrate 1, the first loop layer 1d of the first substrate 1, the first silicon layer 2a of the second substrate 2, and the second loop layer 2d of the second substrate 2 work as the shield for protecting the movable portion 50 and the signal processor 53 from malfunctioning by the outside noise and the like.

Therefore, the device 200 can have the movable portion 50 and the signal processor 53 protected from malfunctioning without any additional shield. Thus, the number of the parts composing the device 200 is reduced, and the manufacturing process of the device 200 is also reduced, so that the manufacturing cost of the device 200 is reduced.

Third Embodiment

Figure 9:
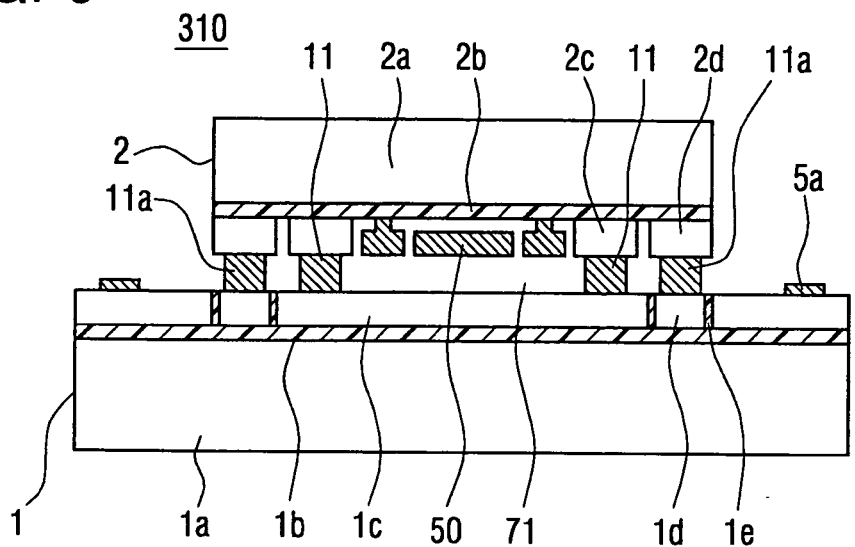
FIG. 9 is a cross sectional view showing a sensor module of a semiconductor device according to a third embodiment of the present invention.
Figure 10:
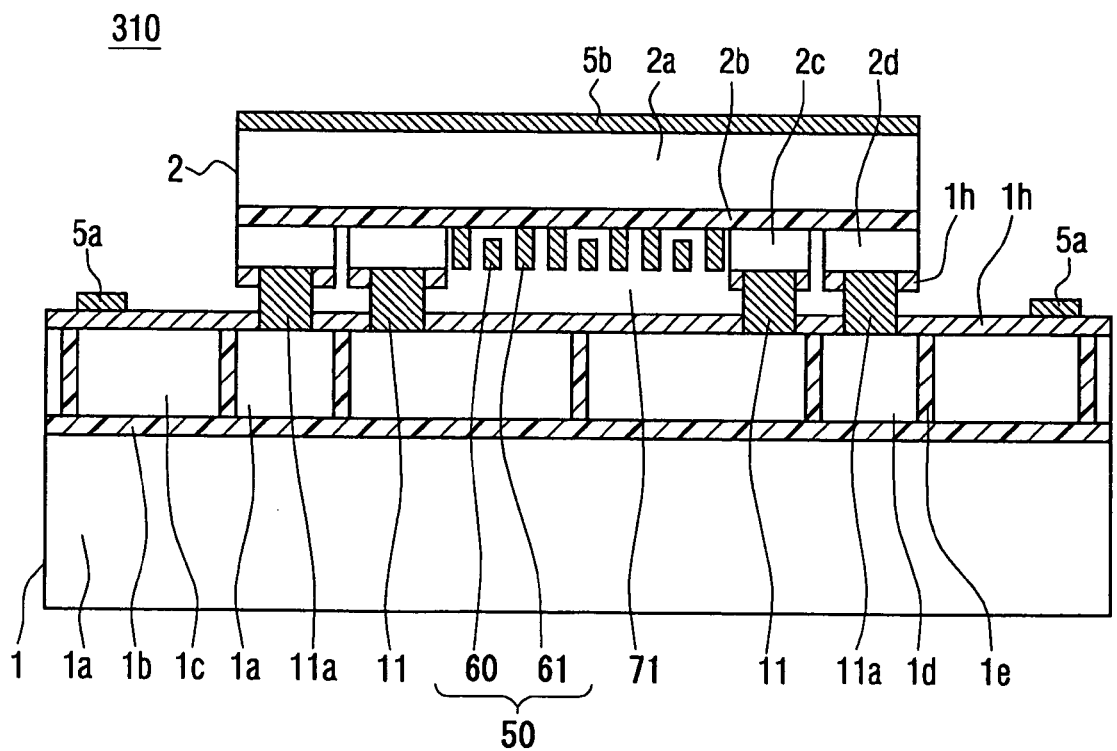
FIG. 10 is a cross sectional view showing the detail of the sensor module, according to the third embodiment.

A semiconductor device 300 having a sensor module 310 according to a third embodiment of the present invention is shown in FIGS. 9 and 10. The sensor module 310 includes the first and second loop layers 1d, 2d. The first loop layer 1d is formed in the second silicon layer 1c of the first substrate 1, and the second loop layer 2d is formed in the second silicon layer 2c of the second substrate 2. The first loop layer 1d of the first substrate 1 is electrically isolated from the first silicon layer 1a of the first substrate 1 by the oxide film 1b. The second loop layer 2d of the second substrate 2 is electrically isolated from the first silicon layer 2a of the second substrate 2 by the oxide film 2b. In this embodiment, the sensor module 310 does not include the first and second poly crystalline silicon layers 1f, 2f and the first and second contact portions 1g, 2g.

As shown in FIG. 10, the movable portion 50 is formed in the second silicon layer 2c of the second substrate 2. The movable portion 50 includes multiple movable electrodes 60 and fixed electrodes 61. The movable electrodes face the fixed electrodes, respectively. The separation layer 1h is formed on the surface of the second silicon layers 1c, 2c of the first and second substrates 1, 2. The separation layer 1h is made of, for example, silicon oxide film. Multiple openings are formed in the separation layer 1h at predetermined positions so that the bumps 11, 11a are formed in the openings. Multiple electric devices (not shown) are formed inside the second silicon layer 1c of the first substrate 1. These electric devices are isolated together with the loop insulation portion 1e as an insulator. The loop insulation portion 1e is made of silicon oxide film and the like.

The first silicon layer 1a of the first substrate 1, the first loop layer 1d of the first substrate 1, the first silicon layer of the second substrate 2, and the second loop layer 2d of the second substrate 2 work as the shield for protecting the movable portion 50 and the signal processor 53 from malfunctioning by the outside noise and the like.

Therefore, the device 300 can have the movable portion 50 and the signal processor 53 protected from malfunctioning without any additional shield. Thus, the number of the parts composing the device 300 is reduced, and the manufacturing process of the device 300 is also reduced, so that the manufacturing cost of the device 300 is reduced.

Fourth Embodiment

Figure 11:
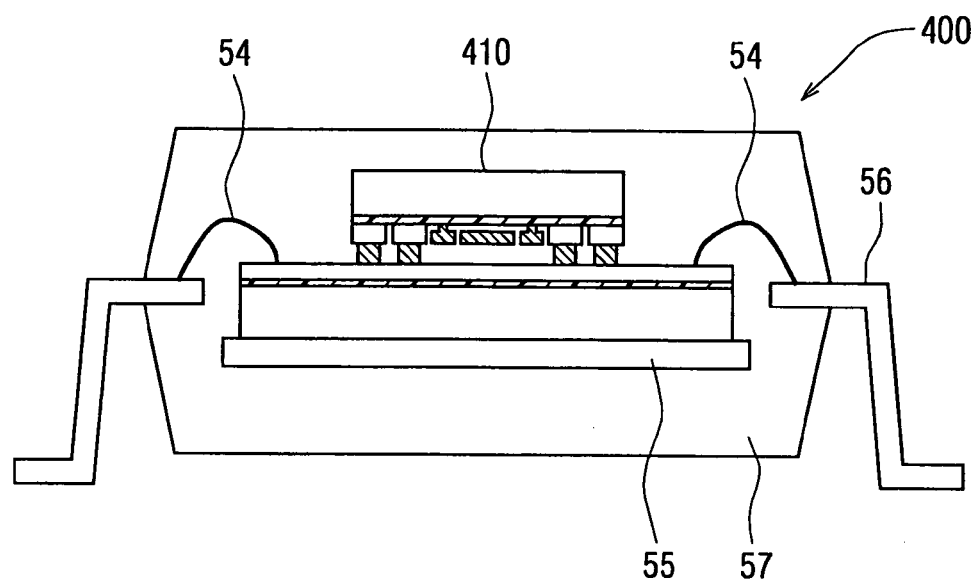
FIG. 11 is a cross sectional view showing a semiconductor device according to a fourth embodiment of the present invention.

A semiconductor device 400 having a sensor module 410 according to a fourth embodiment of the present invention is shown in FIG. 11. Although the sensor module 110 shown in FIG. 2 is accommodated in the package 3, the sensor module 410 is sealed with a resin mold 57 so that the device 400 is provided.

Specifically, the sensor module 410 is mounted on a die pad 55 of the lead frame. The first substrate 1 is electrically connected to an inner lead 56 through a wire 54. The sensor module 410 together with the die pad 55 and the inner lead 56 are sealed with the resin mold 57 so that a resin mold package is formed.

The device 400 can have the movable portion 50 and the signal processor 53 protected from malfunctioning without any additional shield so that the manufacturing cost of the device 400 is reduced.

Fifth Embodiment

Figure 12:
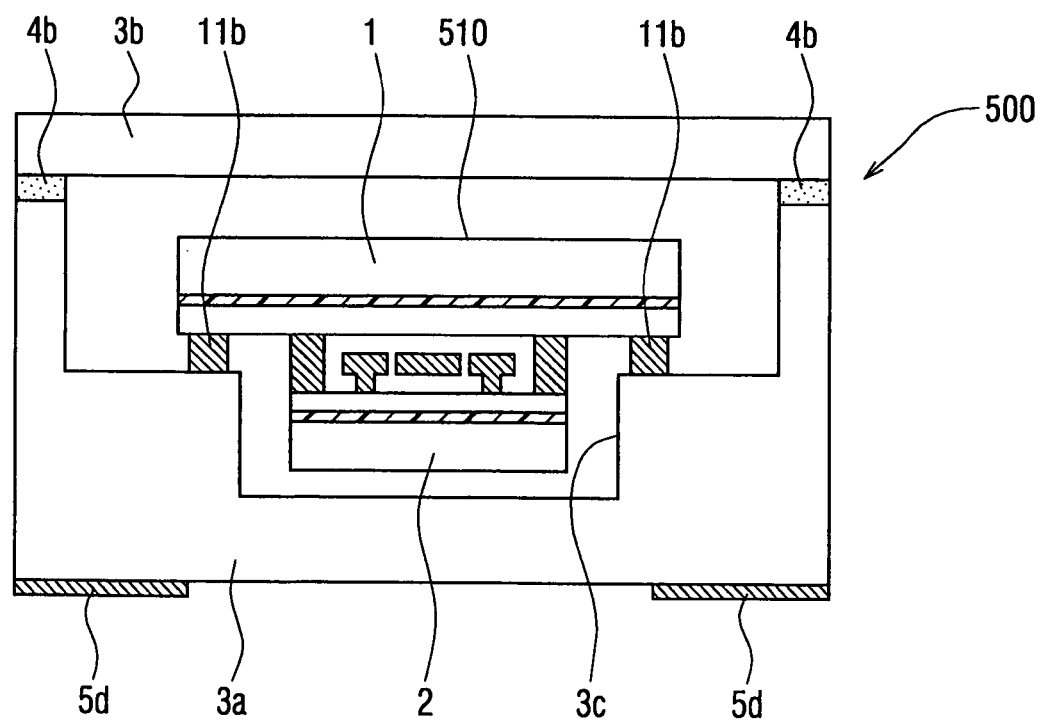
FIG. 12 is a cross sectional view showing a semiconductor device according to a fifth embodiment of the present invention.

A semiconductor device 500 having a sensor module 510 according to a fifth embodiment of the present invention is shown in FIG. 12. Although the sensor module 110 shown in FIG. 2 is electrically connected to the package 3 through the wire 54, the sensor module 510 is electrically connected to the package 3 through a bump 11b.

Specifically, the first substrate 1 of the sensor module 510 is connected to the package 3 through the bump 11b. The second substrate 2 is disposed downside of the sensor module 510. The second substrate 2 is supported to the first substrate 1, which is connected to the package 3. The second substrate 2 is accommodated in a concavity 3c disposed on the bottom of the package 3. The second substrate 2 is separated from the bottom of the package 3.

The device 500 can have the movable portion 50 and the signal processor 53 protected from malfunctioning without any additional shield so that the manufacturing cost of the device 500 is reduced.

Sixth Embodiment

Figure 13:
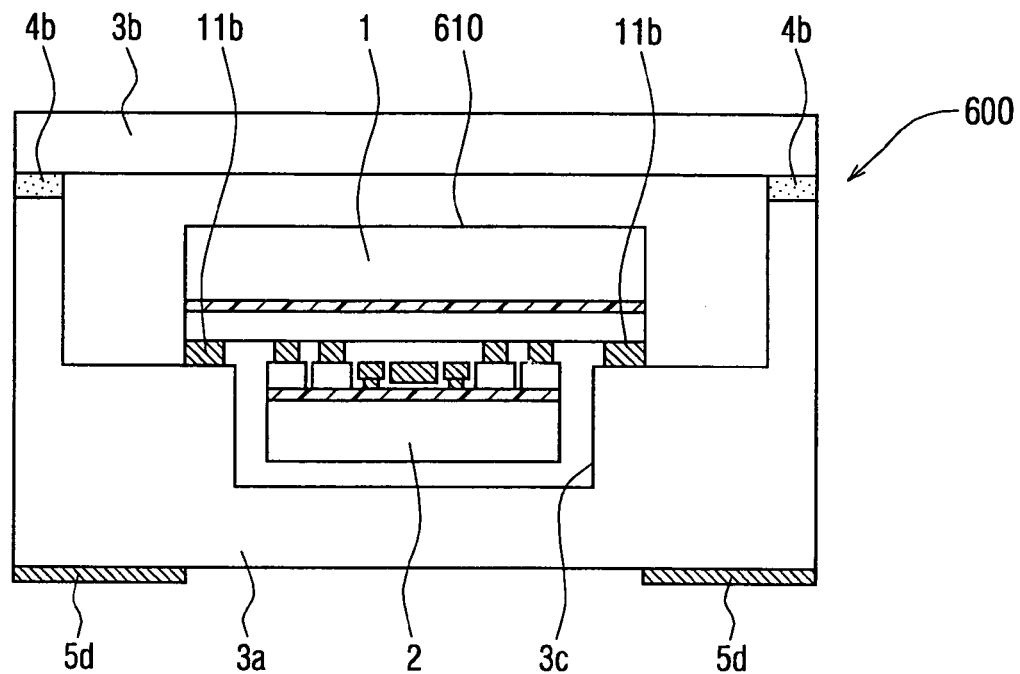
FIG. 13 is a cross sectional view showing a semiconductor device according to a sixth embodiment of the present invention.

A semiconductor device 600 having a sensor module 610 according to a sixth embodiment of the present invention is shown in FIG. 13. The sensor module 610 is electrically connected to the package 3 through the bump 11b.

Specifically, the first substrate 1 of the sensor module 610 is connected to the package 3 through the bump 11b. The second substrate 2 is disposed downside of the sensor module 610. The second substrate 2 is supported to the first substrate 1, which is connected to the package 3. The second substrate 2 is accommodated in the concavity 3c disposed on the bottom of the package 3. The second substrate 2 is separated from the bottom of the package 3.

The sensor module 610 includes the first and second loop layers 1d, 2d. The first loop layer 1d is formed in the second silicon layer 1c of the first substrate 1, and the second loop layer 2d is formed in the second silicon layer 2c of the second substrate 2.

The first silicon layer 1a of the first substrate 1, the first loop layer 1d of the first substrate 1, the first silicon layer 2a of the second substrate 2, and the second loop layer 2d of the second substrate 2 work as the shield for protecting the movable portion 50 and the signal processor 53 from malfunctioning by the outside noise and the like.

Therefore, the device 600 can have the movable portion 50 and the signal processor 53 protected from malfunctioning without any additional shield so that the manufacturing cost of the device 600 is reduced.

(Modifications)

Although the sensor modules 110-610 provide the capacitance type semiconductor acceleration sensor, the sensor modules 110-610 can provide a semiconductor sensor such as an angular rate sensor or a pressure sensor.

Although the first substrate 1 of each sensor module 110-310, 510 is connected to the package 3, the second substrate 2 of each sensor module 110-310, 510 can be connected to the package 3.

Although the conductive adhesion 4a for bonding between the first substrate 1 and the package 3 is applied to the whole surface of bonding surfaces of the first substrate 1 and the package 3, the conductive adhesion 4a can be applied to a part of the bonding surfaces of the first substrate 1 and the package 3. For example, the conductive adhesion 4a is applied to four corners, a center, or a loop shaped part of the bonding surface. That is because the stress generated in the sensor 100-300 becomes smaller.

Although the first and second silicon wafers 30, 33 in the manufacturing process for manufacturing the sensor 200 shown in FIGS. 8A-8F include the impurity having N type conductivity such as P or As, other silicon wafers can be used as the wafers 30, 33. For example, the wafer includes an impurity having P type conductivity such as boron (i.e., B).

Although the first and second substrates 1, 2 are provided by the SOI substrate, at least one of the first and second substrates 1, 2 can be provided by the SOI substrate in some cases that depends on a mounting state of the first and second substrates 1, 2 mounted on the package 3.

Figure 14:
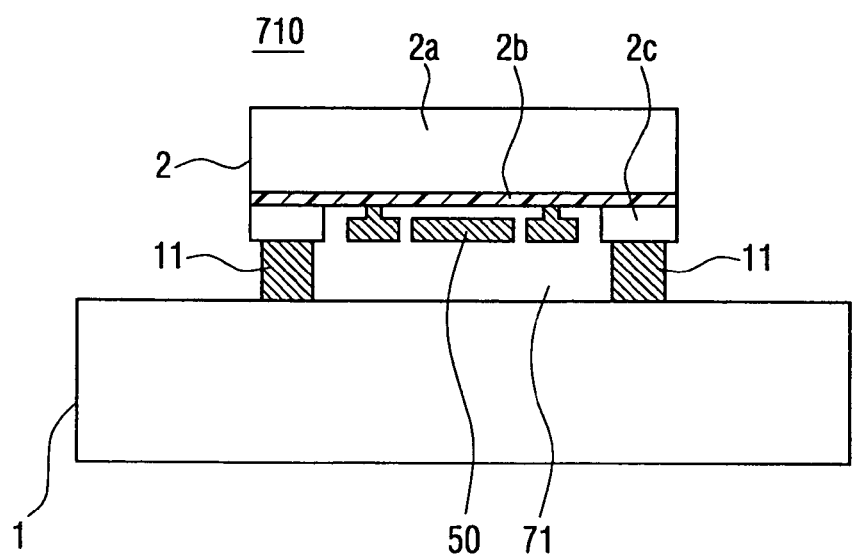
FIG. 14 is a cross sectional view showing a sensor module of a semiconductor device according to modifications of the embodiments of the present invention.
Figure 15:
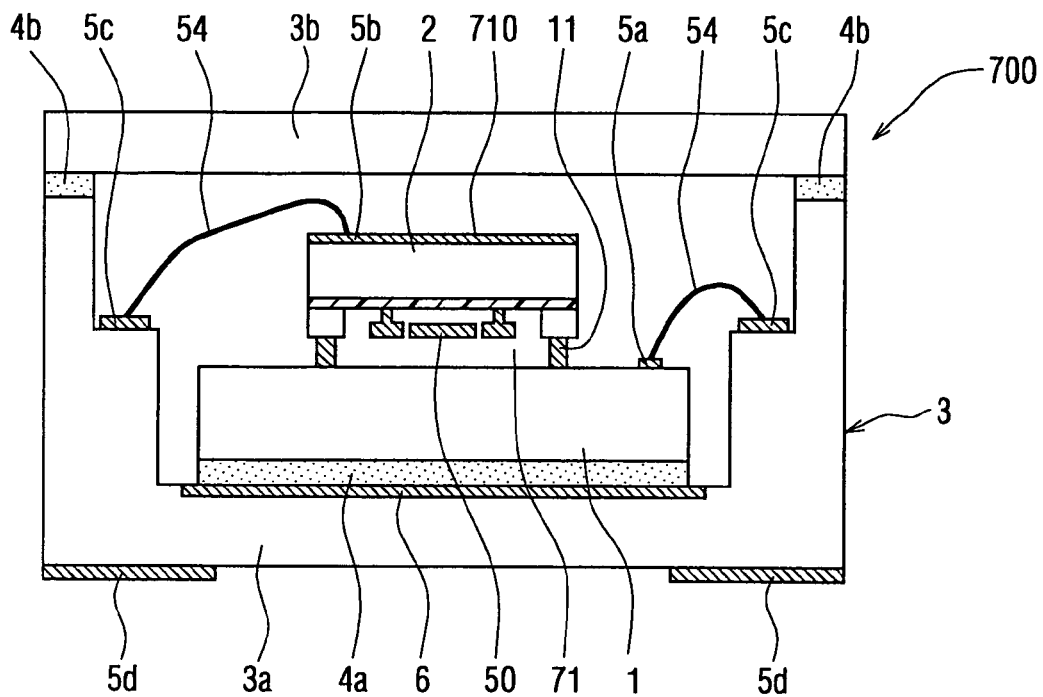
FIG. 15 is a cross sectional view showing a semiconductor device according to the modifications of the embodiments.
Figure 16:
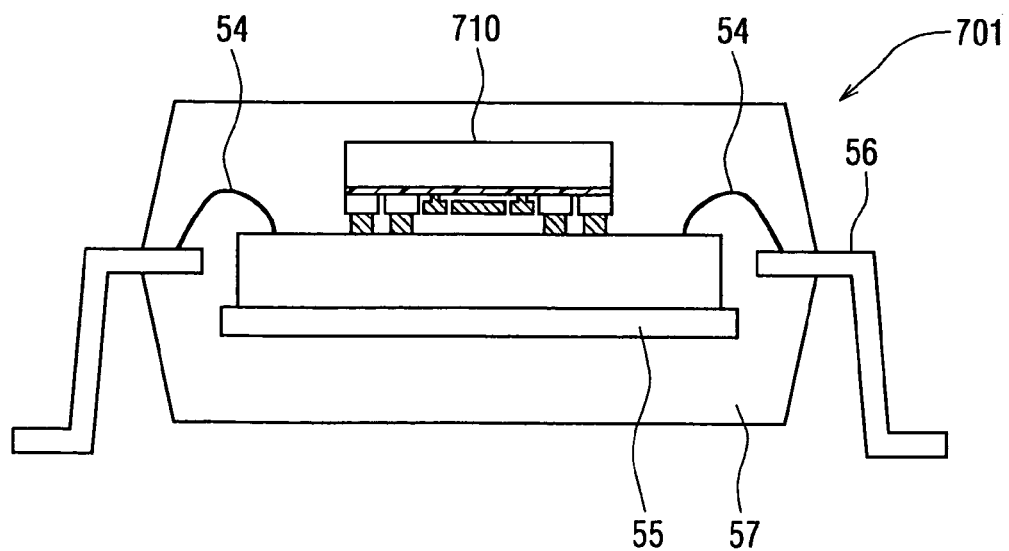
FIG. 16 is a cross sectional view showing a semiconductor device according to the modifications of the embodiments.
Figure 17:
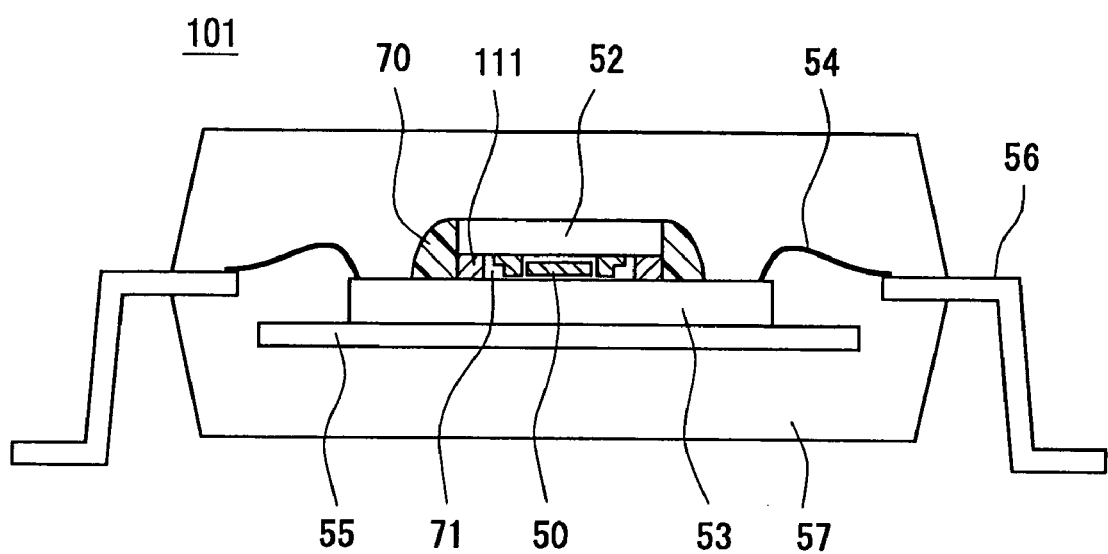
FIG. 17 is a cross sectional view showing a semiconductor device according to a prior art.

FIG. 14 is a cross sectional view showing a sensor module 710 having the first substrate 1 formed of a bulky substrate provided by single crystalline silicon wafer. FIG. 15 shows a semiconductor device 700 having the sensor module 710 shown in FIG. 14. The sensor module 710 is accommodated in the package 3 made of ceramics. FIG. 16 shows a semiconductor device 701 having the sensor module 710 shown in FIG. 14. The sensor module 700 is sealed with the resin mold 57. In these cases, the first substrate 1 is provided by the single crystalline silicon wafer, and only the second substrate 2 is provided by the SOI substrate.

Although the sensor modules 110-710 include two substrates 1, 2, the sensor modules 110-710 can include multiple substrates including the second substrate 2. In this case, the multiple substrates except for the second substrate 2 face the second substrate 2, and the multiple substrates perform similar function of the first substrate 1 or different function of the first substrate 1.

Such changes and modifications are to be understood as being within the scope of the present invention as defined by the appended claims.

What is claimed is:

1. A semiconductor device comprising:
a first substrate including first, second and third layers; and
a second substrate including fourth to sixth layers;
wherein the first substrate provides an electric device,
wherein the second substrate provides a physical quantity sensor,
wherein the first layer of the first substrate is a shield for protecting the electric device and the physical quantity sensor,
wherein the second layer of the first substrate is an insulation layer so that the first substrate is provided by a silicon-on-insulator substrate,
wherein the sixth layer of the second substrate faces the third layer of the first substrate,
wherein the physical quantity sensor includes a movable portion, which is provided by the sixth layer of the second substrate so that the movable portion is sandwiched by the first and second substrates,
wherein the second substrate further includes a second loop layer, which surrounds the movable portion, and
wherein the second loop layer is electrically connected to the third layer of the first substrate with a loop bump so that the movable portion is shielded.

2. The device according to claim 1,
wherein the third layer of the first substrate includes a first loop layer, which surrounds the movable portion so that the first loop layer, the first layer and the second substrate shields the electric device and the physical quantity sensor,
wherein the first substrate further includes a first poly crystalline silicon layer, which is sandwiched between the first and second layers,
wherein the fourth to sixth layers of the second substrate are stacked in this order,
wherein the second substrate further includes a second poly crystalline silicon layer, which is sandwiched between the fourth and fifth layers,
wherein the first loop layer of the first substrate is isolated from the third layer with a first loop insulation portion,
wherein the second loop layer of the second substrate is isolated from the sixth layer with a second loop insulation portion,
wherein the first loop layer is electrically coupled with the first poly crystalline silicon layer, and the second loop layer is electrically coupled with the second poly crystalline silicon layer, and
wherein the first loop layer is electrically coupled with the second loop layer with the bump.

3. A semiconductor device comprising:
a first substrate including first, second and third layers;
a second substrate includes fourth to sixth layers; and
a bump,
wherein the first substrate provides an electric device,
wherein the second substrate provides a physical quantity sensor,
wherein the first layer of the first sub state is a shield for protecting the electric device and the physical quantity sensor,
wherein the electric device is disposed in the third layer of the first substrate,
wherein the physical quantity sensor is disposed in the sixth layer of the second substrate,
wherein the second layer of the first substrate is made of an insulation layer so that the first substrate is provided by a silicon-on-insulator substrate,
wherein the physical quantity sensor includes a movable portion, which is provided by the sixth layer of the second substrate so that the movable portion is sandwiched by the first and second substrates,
wherein the movable portion is movable in accordance with a physical quantity applied to the device so that the physical quantity sensor outputs a signal corresponding to a displacement of the movable portion,
wherein the first substrate faces the second substrate so that the electric device electrically connects to the physical quantity sensor,
wherein the bump is disposed between the third layer of the first substrate and the sixth layer of the second substrate,
wherein the first layer of the first substrate and the fourth layer of the second substrate are disposed outside, the fourth layer of the second substrate being apposite to the physical quantity sensor, wherein the sixth layer of the second substrate faces the third layer of the first substrate so that the first substrate is electrically connected to the second substrate through the bump, wherein the second substrate further includes a second loop layer, which surrounds the movable portion, and wherein the second loop layer is electrically connected to the third layer of the first substrate with a loop bump so that the movable portion is shielded.

4. The device according to claim 3, wherein the third layer of the first substrate includes a first loop layer, which surrounds the movable portion so that the first loop layer, the first layer and the second substrate shields the electric device and the physical quantity sensor, wherein the first substrate further includes a first poly crystalline silicon layer, which is sandwiched between the first and second layers, wherein the second substrate further includes fourth to sixth layers, which are stacked in this order, wherein the sixth layer of the second substrate provides the one side of the second substrate, and the fourth layer of the second substrate provides the other side of the second substrate, wherein the second substrate further includes a second poly crystalline silicon layer, which is sandwiched between the fourth and fifth layers, wherein the first loop layer of the first substrate is isolated from the third layer with a first loop insulation portion, wherein the second loop layer of the second substrate is isolated from the sixth layer with a second loop insulation portion, wherein the first loop layer is electrically coupled with the first poly crystalline silicon layer, and the second loop layer is electrically coupled with the second poly crystalline silicon layer, and wherein the first loop layer is electrically coupled with the second loop layer with the bump.

5. A semiconductor device comprising:
a first substrate including first, second and third layers;
a second substrate; and
a loop bump, wherein the first substrate provides one of an electric device and a physical quantity sensor, wherein the second substrate provides the other one of the electric device and the physical quantity sensor, wherein the first layer of the first substrate is a shield for protecting the electric device and the physical quantity sensor, wherein the physical quantity sensor includes a movable portion, wherein the third layer of the first substrate includes a first loop layer, which surrounds the movable portion, wherein the loop bump is disposed between the first and second substrates, and surrounds the movable portion, wherein the loop bump is electrically coupled with the first loop layer so that the loop bump, the first loop layer, the first layer and the second substrate shield the electric device and the physical quantity sensor, wherein the first substrate further includes and inner pad, and outer pad, and wire layer, wherein the inner pad is disposed inside of the first loop layer, and the outer pad is disposed outside of the first loop layer, wherein the inner pad is electrically coupled with the outer pad through the wire layer so that a signal from the movable portion is output to and external circuit, and wherein the wire layer is electrically insulated from the loop bump with an insulation film.

6. The device according to claim 5,
wherein the first layer is grounded.

7. The device according to claim 5, wherein the one of the electric device and the physical quantity sensor is disposed in the third layer of the first substrate, wherein the other one of the electric device and the physical quantity sensor is disposed one side of the second substrate, and wherein the second layer of the first substrate is made of and insulation layer so that the first and third layers are electrically isolated.

8. The device according to claim 7, wherein the movable portion is movable in accordance with a physical quantity applied to the device so that the physical quantity sensor outputs the signal corresponding to a displacement of the movable portion, and wherein the first substrate faces the second substrate so that the electric device electrically connects to the physical quantity sensor.

9. The device according to claim 8, wherein the first substrate includes a bump disposed on the third layer of the first substrate, wherein the third layer of the first substrate faces the second substrate so that the first substrate is electrically connected to the second substrate through the bump, and wherein the first layer of the first substrate and the other side of the second substrate are disposed outside, the other side of the second substrate being opposite to the other one of the electric device and the physical quantity sensor.

10. The device according to claim 9, wherein the first and third layers of the first substrate are made of semiconductor, wherein the second substrate is made of semiconductor, and wherein the electric device controls the physical quantity sensor, and the physical quantity sensor outputs the signal to the electric device though the bump.

11. The device according to claim 10, wherein the physical quantity sensor is an acceleration sensor, an angular rate sensor or a pressure sensor, wherein the first substrate is provided by a silicon-on-insulator substrate, and wherein the electric device is a signal processor.

12. A semiconductor device comprising:
a first substrate including first, second and third layers;
a second substrate;
a loop bump; and
a bump, wherein the first substrate provides one of an electric device and a physical quantity sensor, wherein the second substrate provides the other one of the electric device and the physical quantity sensor, wherein the first layer of the first substrate is a shield for protecting the electric device and the physical quantity sensor, wherein the one of the electric device and the physical quantity sensor is disposed in the third layer of the first substrate, wherein the other one of the electric device and the physical quantity sensor is disposed in one side of the second substrate, wherein the second layer of the first substrate is made of an insulation layer so that the first and third layers are electrically isolated, wherein the physical quantity sensor includes a movable portion, wherein the movable portion is movable in accordance with a physical quantity applied to the device so that the physical quantity sensor outputs a signal corresponding to a displacement of the movable portion, wherein the first substrate faces the second substrate so that the electric device electrically connects to the physical quantity sensor, wherein the bump is disposed between the third layer of the first substrate and the one side of the second substrate, wherein the third layer of the first substrate faces the second substrate so that the first substrate is electrically connected to the second substrate through the bump, wherein the first layer of the first substrate and the other side of the second substrate are disposed outside the other side of the second substrate being opposite to the other one of the electric device and the physical quantity sensor, wherein the third layer of the first substrate includes a first loop layer, which surrounds the movable portion, wherein the loop bump is disposed between the first and second substrates, and surrounds the movable portion, wherein the loop bump is electrically coupled with the first loop layer so that the loop bump, the first loop layer, the first layer and the second substrate shield the electric device and the physical quantity sensor, wherein the first substrate further includes an inner pad, an outer pad and a wire layer, wherein the inner pad is disposed inside of the first loop layer, and the outer pad is disposed outside of the first loop layer, wherein the inner pad is electrically coupled with the outer pad through the wire layer so that the signal from the movable portion is output to an external circuit, and wherein the wire layer is electrically insulated from the loop bump with an insulation film.

13. The device according to claim 5, wherein the second layer of the first substrate is an insulation layer so that the first substrate is provided by a silicon-on-insulator substrate, wherein one side of the second substrate faces the third layer of the first substrate, wherein the movable portion of the physical quantity sensor is provided by the one side of the second substrate so tat the movable portion is sandwiched by the first and second substrates, wherein the second substrate further includes a second loop layer, which surrounds the movable portion, and wherein the second loop layer is electrically connected to the third layer of the first substrate with the loop bump so that the movable portion is shielded.

14. The device according to claim 13, wherein the first substrate further includes a first poly crystalline silicon layer, which is sandwiched between the first and second layers, wherein the second substrate further includes fourth to sixth layers, which are stacked in this order, wherein the sixth layer of the second substrate provides the one side of the second substrate, and the fourth layer of the second substrate provides the other side of the second substrate, wherein the second substrate further includes a second poly crystalline silicon layer, which is sandwiched between the fourth and fifth layers, wherein the first loop layer of the first substrate is isolated from the third layer with a first loop insulation portion, wherein the second loop layer of the second substrate is isolated from the sixth layer with a second loop insulation portion, wherein the first loop layer is electrically coupled with the first poly crystalline silicon layer, and the second loop layer is electrically coupled with the second poly crystalline silicon layer, and wherein the first loop layer is electrically coupled with the second loop layer with the loop bump.

15. The device according to claim 12, wherein the first substrate is provided by a silicon-on-insulator substrate, wherein the one side of the second substrate faces the third layer of the first substrate, wherein the movable portion of the physical quantity sensor is provided by the one side of the second substrate so that the movable portion is sandwiched by the first and second substrates, wherein the second substrate further includes a second loop layer, which surrounds the movable portion, and wherein the second loop layer is electrically connected to the third layer of the first substrate with the loop bump so that the movable portion is shielded.

16. The device according to claim 15, wherein the first substrate further includes a first poly crystalline silicon layer, which is sandwiched between the first and second layers, wherein the second substrate further includes fourth to sixth layers, which are stacked in this order, wherein the sixth layer of the second substrate provides the one side of the second substrate, and the fourth layer of the second substrate provides the other side of the second substrate, wherein the second substrate further includes a second poly crystalline silicon layer, which is sandwiched between the fourth and fifth layers, wherein the first loop layer of the first substrate is isolated from the third layer with a first loop insulation portion, wherein the second loop layer of the second substrate is isolated from the sixth layer with a second loop insulation portion, wherein the first loop layer is electrically coupled with the first poly crystalline silicon layer, and the second loop layer is electrically coupled with the second poly crystalline silicon layer, and wherein the first loop layer is electrically coupled with the second loop layer with the loop bump.

17. A semiconductor device comprising:

a first substrate including first, second and third layers;

a second substrate; and a loop bump, wherein the first substrate provides one of an electric device and a physical quantity sensor, wherein the second substrate provides the other one of the electric device and the physical quantity sensor, wherein the first layer of the first substrate is a shield for protecting the electric device and the physical quantity sensor, wherein the physical quantity sensor includes a movable portion, wherein the loop bump is disposed between the first and second substrates, and surrounds the movable portion, wherein the first substrate further includes an inner pad, an outer pad and a wire layer, wherein the inner pad is disposed inside of the loop bump, and the outer pad is disposed outside of the loop bump, wherein the inner pad is electrically coupled with the outer pad through the wire layer, and wherein the wire layer is electrically insulated from the loop bump with an insulation film.

18. The device according to claim 17, wherein the first layer is grounded.

19. The device according to claim 17, wherein the one of the electric device and the physical quantity sensor is disposed in the third layer of the first substrate, wherein the other one of the electric device and the physical quantity sensor is disposed one side of the second substrate, and wherein the second layer of the first substrate is made of an insulation layer so that the first and third layers are electrically isolated.

20. The device according to claim 19, wherein the movable portion is movable in accordance with a physical quantity applied to the device so that the physical quantity sensor outputs the signal corresponding to a displacement of the movable portion, and wherein the first substrate faces the second substrate so that the electric device electrically connects to the physical quantity sensor.

21. The device according to claim 20, wherein the first substrate includes a bump disposed on the third layer of the first substrate, wherein the third layer of the first substrate faces the second substrate so that the first substrate is electrically connected to the second substrate through the bump, and wherein the first layer of the first substrate and the other side of the second substrate are disposed outside, the other side of the second substrate being opposite to the other one of the electric device and the physical quantity sensor.

22. The device according to claim 21, wherein the first and third layers of the first substrate are made of semiconductor, wherein the second substrate is made of semiconductor, and wherein the electric device controls the physical quantity sensor, and the physical quantity sensor outputs the signal to the electric device through the bump.

23. The device according to claim 22, wherein the physical quantity sensor is an acceleration sensor, an angular rate sensor or a pressure sensor, wherein the first substrate is provided by a silicon-on-insulator substrate, and wherein the electric device is a signal processor.

24. The device according to claim 17, wherein the second layer of the first substrate is an insulation layer so that the first substrate is provided by a silicon-on-insulator substrate, wherein one side of the second substrate faces the third layer of the first substrate, wherein the movable portion of the physical quantity sensor is provided by the one side of the second substrate so that the movable portion is sandwiched by the first and second substrates, wherein the third layer of the first substrate includes a first loop layer, which surrounds the movable portion, wherein the second substrate further includes a second loop layer, which surrounds the movable portion, and wherein the second loop layer is electrically connected to the third layer of the first substrate with the loop bump so that the movable portion is shielded.

25. The device according to claim 24, wherein the first substrate further includes a first poly crystalline silicon layer, which is sandwiched between the first and second layers, wherein the second substrate further includes fourth to sixth layers, which are stacked in this order, wherein the sixth layer of the second substrate provides the one side of the second substrate, and the fourth Layer of the second substrate provides the other side of the second substrate, wherein the second substrate further includes a second poly crystalline silicon layer, which is sandwiched between the fourth and fifth layers, wherein the first loop layer of the first substrate is isolated from the third layer with a first loop insulation portion, wherein the second loop layer of the second substrate is isolated from the sixth layer with a second loop insulation portion, wherein the first loop layer is electrically coupled with the first poly crystalline silicon layer, and the second loop layer is electrically coupled with the second poly crystalline silicon layer, and wherein the first loop layer is electrically coupled with the second loop layer with the loop bump.

* * * * *